United States Patent [19]

Harp et al.

[11] 4,238,747

[45] Dec. 9, 1980

[54] MODE FILTER APPARATUS

[75] Inventors: Robert S. Harp, Westlake Village; Kenneth J. Russell, Thousand Oaks, both of Calif.

[73] Assignee: The United States of America as represented by the Secretary of the Air Force, Washington, D.C.

[21] Appl. No.: 65,678

[22] Filed: Aug. 10, 1979

[51] Int. Cl.³ .................. H01P 1/16; H01P 1/162; H01P 7/04; H01P 7/06
[52] U.S. Cl. ..................... 333/228; 330/56; 330/287; 331/96; 331/101; 333/231; 333/251
[58] Field of Search ........ 333/250, 245, 251, 227–228, 333/24 R, 27, 22 R, 81 A, 81 B; 331/56, 96, 97, 107 D, 107 DP, 117 D, 107 P, 101; 330/45, 56, 124 R, 286, 287

[56] References Cited

U.S. PATENT DOCUMENTS

| | | | |
|---|---|---|---|
| 3,582,813 | 6/1971 | Hines | 331/56 |
| 3,733,560 | 5/1973 | Oltman, Jr. et al. | 333/228 X |
| 3,775,694 | 11/1973 | Quine | 331/96 X |
| 3,783,401 | 1/1974 | Oltman, Jr. | 333/228 X |
| 4,175,257 | 11/1979 | Smith et al. | 330/56 |
| 4,189,684 | 2/1980 | Hieber et al. | 331/56 |

Primary Examiner—Marvin L. Nussbaum
Attorney, Agent, or Firm—Joseph E. Rusz; William Stepanishen

[57] ABSTRACT

A mode filter apparatus for preventing unwanted modes in a multi-moded structure utilizing a radial plurality of resonant slots on the bottom of the filter cavity. The top of the filter cavity includes a variable height center section to provide mode selectivity in cooperation with the resonant slots.

8 Claims, 11 Drawing Figures

MODE FILTER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a filter apparatus and in particular to a multi-mode filter apparatus having mode selectivity.

Microwave transmission lines are used for transmission of electromagnetic energy at microwave frequencies from one point to another. A transmission line may be defined as a system of material boundaries which forms a continuous path from one place to another and is capable of directing the transmission of electromagnetic energy along this path. At microwave frequencies, a wide variety of metallic and dielectric structures are used, the choice depending upon the specific application and frequency range. The wavelengths at microwave frequencies are small, ranging from a few millimeters to under 1 m. It is therefore typical of microwave transmission lines that even when they are physically rather short, their length measured in electrical wavelengths ranges from an appreciable fraction of a wavelength to many wavelengths. For this reason, if microwave transmission lines are not carefully designed, substantial losses of energy by radiation, reflection, and attenuation may be encountered.

Microwave filters are operated at microwave frequencies which are generally considered to be above 1 GHz. However, they may also be used in the much lower high-frequency (hf) range of 3-30 MHz. The components are no longer lumped elements, but consist of sections of transmission lines, strip lines, coupled lines, and waveguide structures. A form of microwave filter is the overmoded circular cylindrical resonant cavity diode combiner which may provide a possible alternative to microwave power tubes. As the required power output increases, the number of diodes and the cavity dimensions increase. As the dimensions increase, the number of higher order modes increases. The higher order modes should be suppressed to keep the frequency spectrum clean and the power in the lowest possible mode consistent with the required frequency.

SUMMARY OF THE INVENTION

The present invention utilizes a cylindrical resonant cavity having a radial pattern of resonant slots in the bottom plate and a variable height center portion in the top plate of the apparatus. The mode selectivity of the mode filter apparatus may be controlled by varying the height of the center portion of the top plate, as well as by changing the length, width and depth of the radial slots. The mode selectivity may also be varied by filling the radial slots with absorbing material to various depths.

It is one object of the present invention, therefore, to provide an improved mode filter apparatus for preventing and suppressing unwanted resonant modes in a multi-mode apparatus.

It is another object of the invention to provide an improved mode filter apparatus utilizing a radial pattern of resonant slots on the bottom of the resonant cavity.

It is still another object of the invention to provide an improved mode filter apparatus utilizing a variable height center portion in the top plate of the cavity apparatus.

It is yet another object of the invention to provide an improved mode filter apparatus wherein the mode selectivity characteristics may be varied by changing the length, width and depth of the radial slots.

These and other advantages, objects and features of the invention will become more apparent from the following description taken in connection with the illustrative embodiment in the accompanying drawings.

DESCRIPTION OF THE PREFERRED EMBODIMENT

Figure 1:
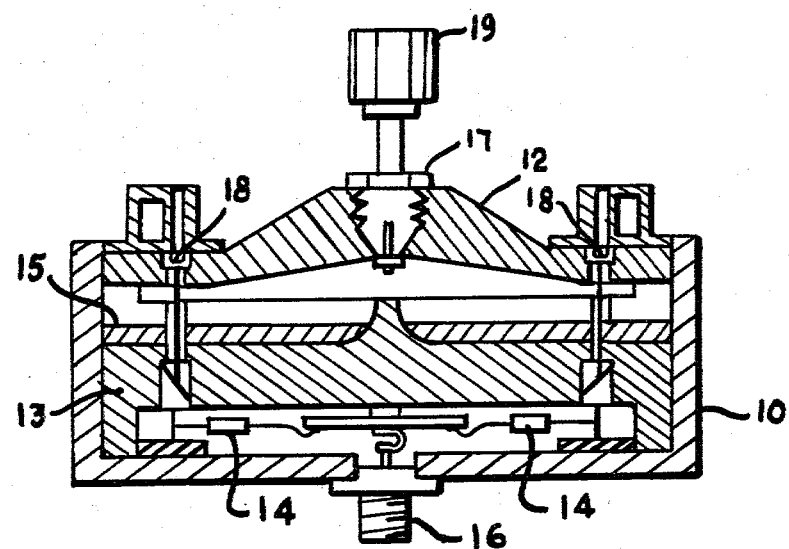
FIG. 1 is a cross-sectional view of the mode filter apparatus according to the present invention.

Referring now to FIG. 1, there is shown a mode filter apparatus utilizing a 64 diode power combiner as the packaging medium. The power combiner comprises a lower member 10 and an uppe plate 12. The lower member 10 includes an internal structure 13 which contains and separates the bias resistors 14 from the mode filter 15. The bias resistors 14 are radially disposed about the bias input connector 16. The upper plate 12 has a coupling probe 17 with collet centrally located in said plate. A plurality of diodes 18 are equiradially disposed around the periphery of said upper plate 12. A 7 mm coax output connector 19 is connected to the coupling probe 17.

Figure 2:
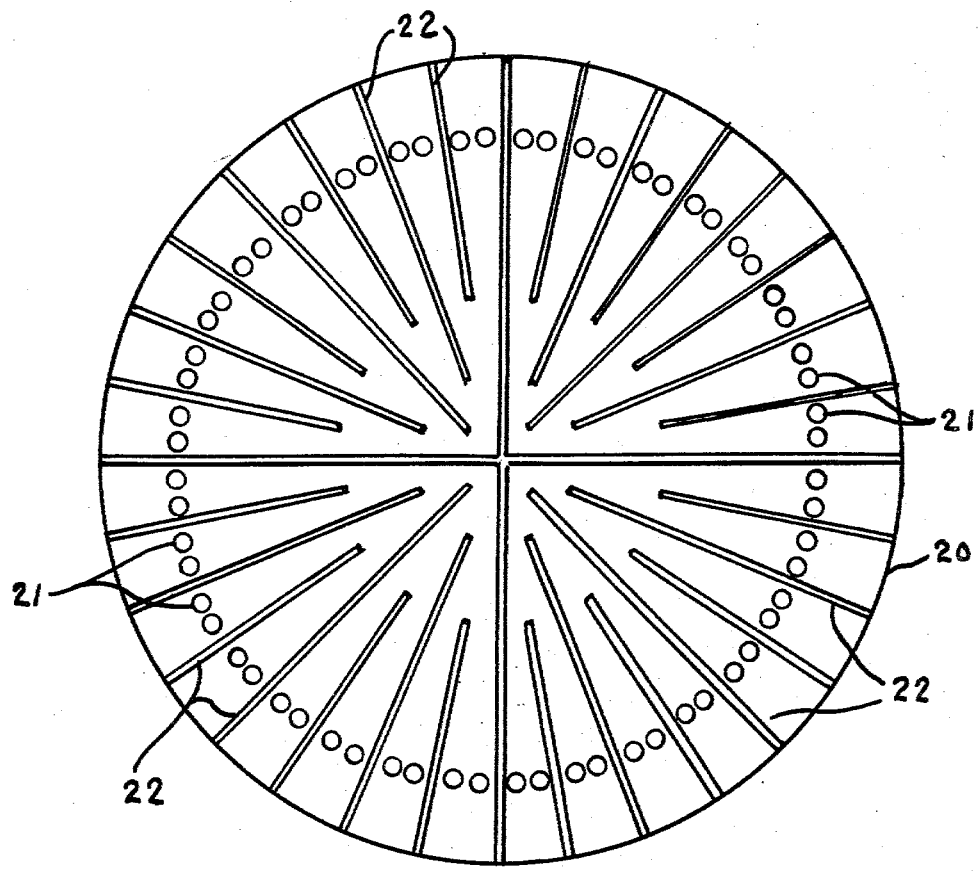
FIG. 2 is a top view of the bottom plate of the mode filter apparatus.
Figure 4:
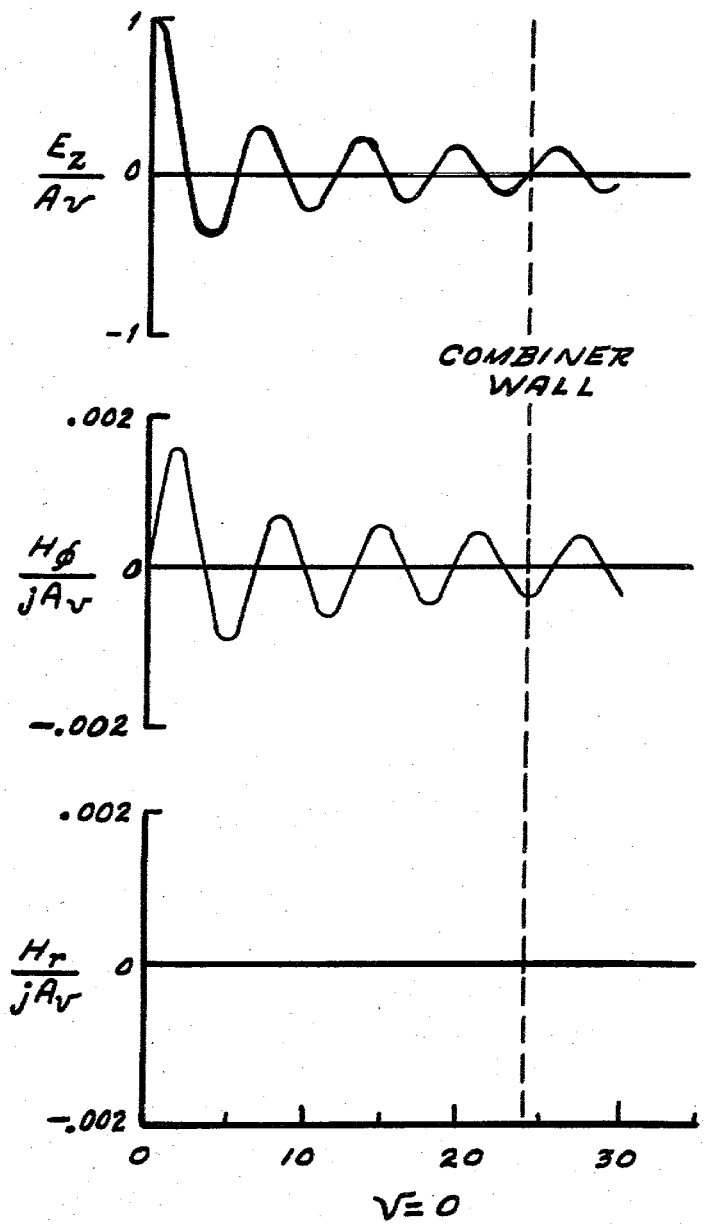
FIGS. 4 through 7 are graphical representations of the normalized field components for various orders of Bessel equation.
Figure 5:
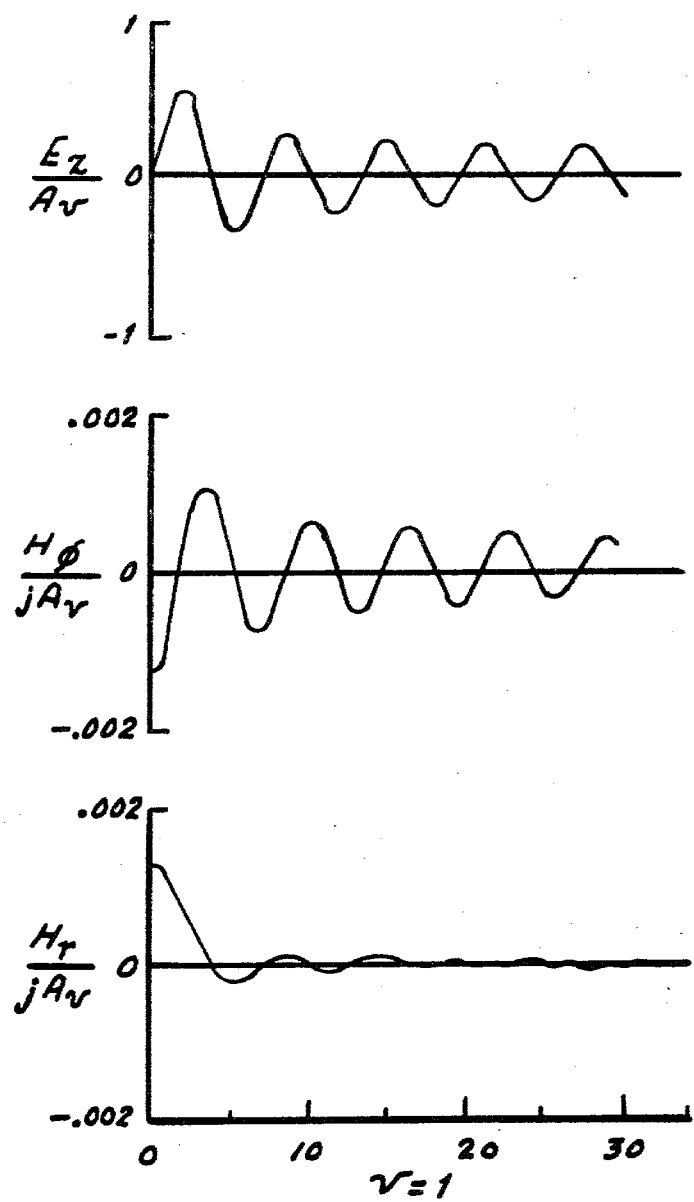
Figure 6:
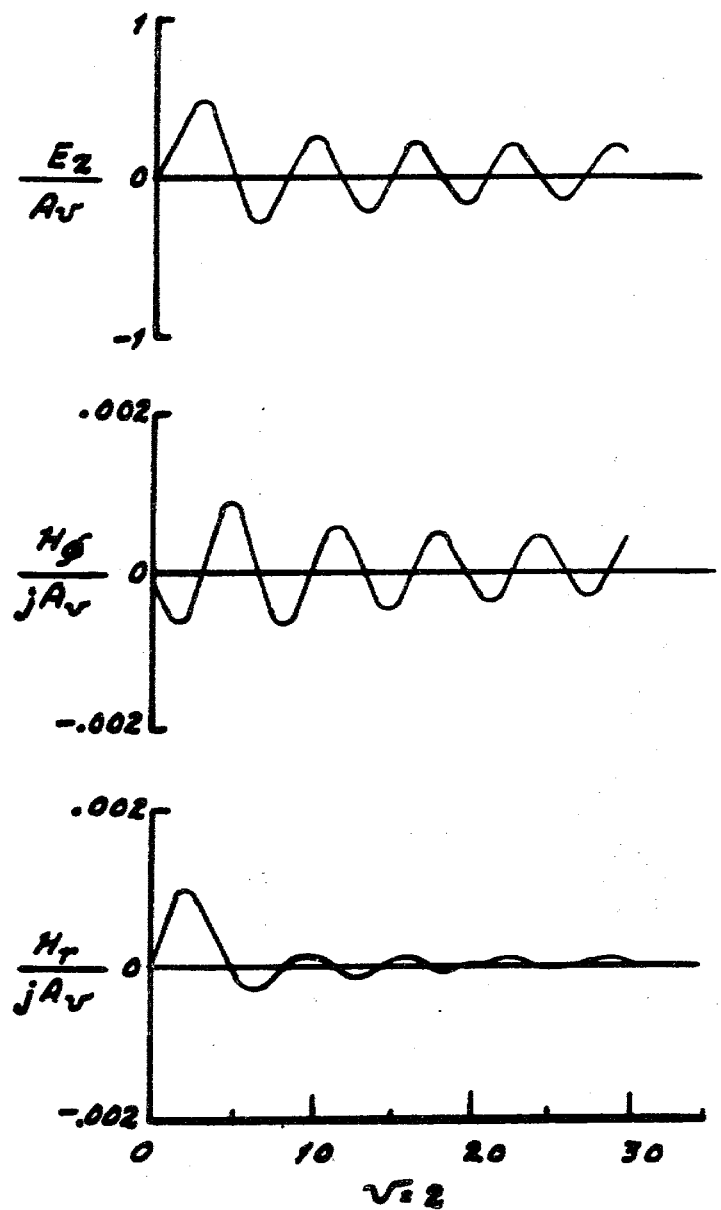

Turning now to FIG. 2, there is shown in greater detail a top view of the mode filter apparatus 20. The mode filter apparatus 20 contains a plurality of resonant slots 22 which are radially disposed about the center point of the mode filter apparatus. There is a plurality of holes 21 disposed near the outer edge of the mode filter apparatus 20 through which holes, the diodes in the upper plate are connected to the bias resistor network in the lower member. The length, width and depth of the resonant slots 22 depends upon the particular modes that are to be suppressed. Specific slot design examples and the results corresponding thereto will be later shown.

Figure 3:
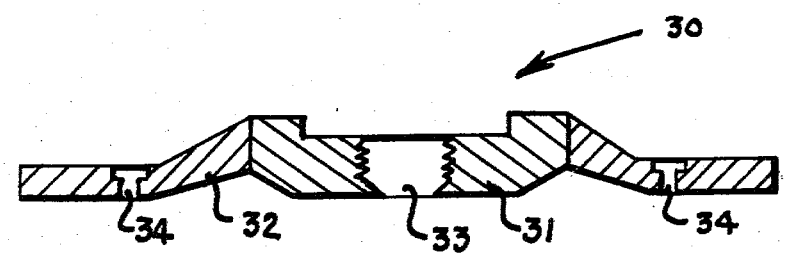
FIG. 3 is a cross-sectional view of the top plate of the mode filter apparatus.

In FIG. 3 there is shown in greater detail, the top plate of the diode power combiner. The top plate 30 comprises an adjustable center plug member 31 which is located in the upper plate 32. The adjustable center plug member 31 which contains the collet mount 33, may be positioned according to the desired suppression mode. The upper plate 32 contains diode mounting holes 34.

Figure 7:
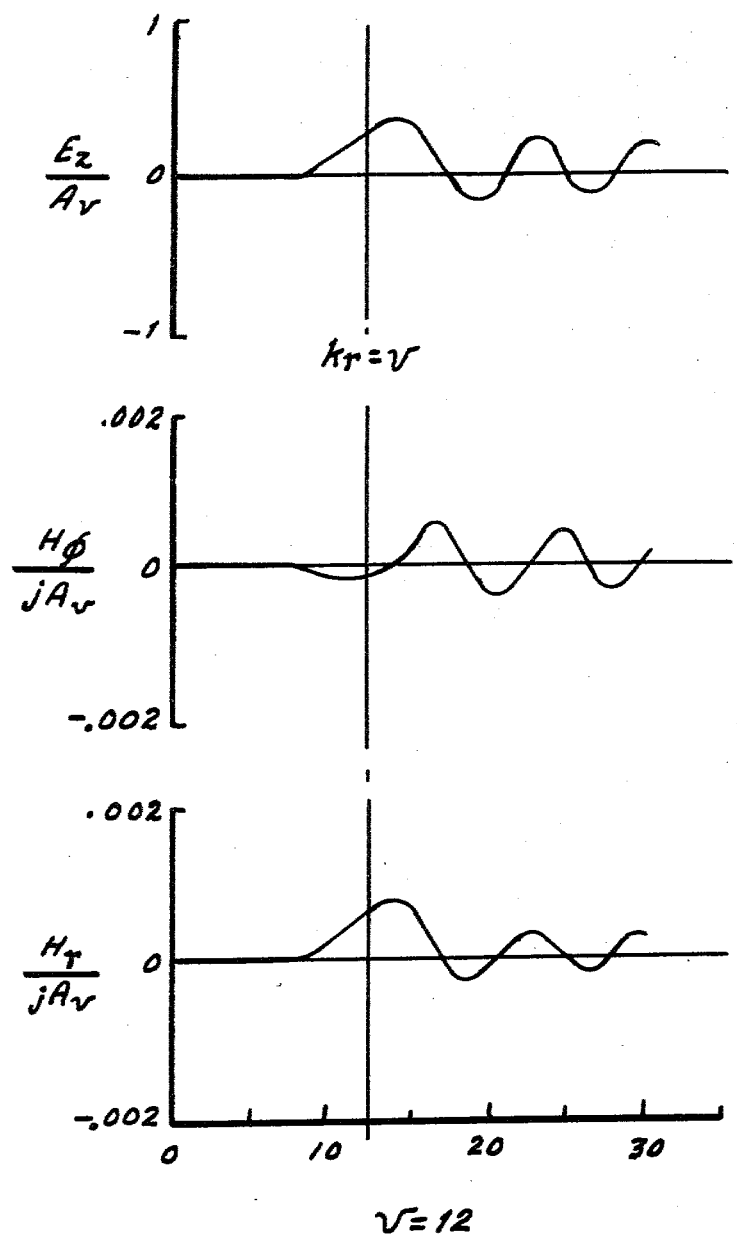

The operation of the mode filter apparatus may be better understood by the following analysis of the fields and resulting currents in a cylindrical cavity. The fields are of the form $$E_z = A_\nu Z_\nu(kr) \sin \nu\phi$$
$$H_\phi = -\frac{jA_\nu}{\eta} Z_\nu'(kr) \sin \nu\phi$$
$$H_r = \frac{j\nu A_\nu}{\eta kr} Z_\nu(kr) \cos \nu\phi,$$

where $Z_\nu$ can be any solution of Bessel's equation, such as $J_\nu(kr)$ or $H_\nu(kr)$, $\eta$ is the impedance of free space, $\nu$ is the order of the solution, and $A_\nu$ is a constant. In an actual amplifier with more power traveling inward than outward, the fields would be described by Hankel functions of unequal amplitudes, but since the various types of solutions are linear combinations of one another, it is only necessary to look at the fields and surface currents described by $J_\nu(kr)$. The normalized maximum field components are shown in FIGS. 4 through 7. A mode filter which has radial absorbing slots will be most effective where the azimuthal surface current, proportional to $H_r$, is strongest. For low values of $\nu$, this occurs close to the center, whereas for higher values of $\nu$ the most effective radius is farther out. This behavior is explained as follows. Since $E_z$ is zero along several radii where $\sin \nu\phi$ is zero, conducting walls may be inserted at these points without disturbing the fields. This makes the geometry that of a sectorial horn tapering to zero width. This may also be thought of as a waveguide, propagating a $TE_{10}$ mode, whose width tapers to zero. At some intermediate point where the wall spacing is $\lambda/2$, the waveguide will be at cutoff, the $E_z$ component will become maximum due to the increase in wave impedance, and the surface currents will be essentially azimuthal. Inward from this point, the wave will be evanescent, decreasing exponentially in amplitude. This behavior is shown in FIG. 7, where the cutoff radius is indicated. For any value of $\nu$ the most effective radius for the mode filter slots would be given approximately by $$s\pi r = \nu\lambda \text{ or } kr = \nu.$$

The most difficult mode to eliminate is apparently the dipole mode ($\nu = 1$) for which the absorbing slots must extend far in toward the center.

The effect of a mode filter in a combiner may be estimated by considering a cylindrical cavity of height h and radius a. The fields for the cylindrical cavity are (assuming $z_{84}(kr) = J_\nu(kr)$)

$$E_z = A_\nu J_\nu(kr) \sin \nu\phi$$
$$H_\phi = -j\frac{A_\nu}{\eta} J_\nu'(kr) \sin \nu\phi$$
$$H_r = j\frac{\nu A_\nu}{kr\eta} J_\nu(kr) \cos \nu\phi,$$

where the axis of the cylindrical cavity is assumed to lie along the axis of the cylindrical coordinate system, $\nu$ is the order of the mode and Bessel function, $A_\nu$ is a constant, and $\eta$ is the impedance of free space. The stored energy $U_\nu$ for a particular mode $\nu$ is $$U_\nu = \frac{\epsilon}{2} \int_0^a \int_0^{2\pi} \int_0^h |E_z|^2 \, r \, dr \, d\phi \, dz =$$
$$\frac{\pi}{2} \frac{\epsilon h A_\nu^2}{k^2} \int_0^{ka} kr \, J_\nu^2(kr) \, d(kr)$$

where $\epsilon$ is the permittivity. The slots will be assumed to be only on the bottom of the cavity and to be the major loss mechanism. Assuming the surface resistivity of the bottom surface is $R_S$, the losses $W_\nu$ are given by $$W_\nu = \frac{R_S}{2} \int_0^a \int_0^{2\pi} |J_\phi|^2 \, r \, dr \, d\phi =$$
$$\frac{R_S}{2} \int_0^a \int_0^{2\pi} |H_r|^2 \, r \, dr \, d\phi$$

where $J_\phi$ is the $\phi$ component of current density. Then it can be shown that $$W_\nu = \frac{R_S \nu^2 A_\nu^2}{2\eta^2 k^2} \int_0^{ka} \frac{1}{kr} J_\nu^2(kr) \, d(kr).$$

Then $$Q_\nu = \frac{\omega U_\nu}{W_\nu} = \frac{\omega h \mu}{\nu^2 R_S} \frac{\int_0^{ka} X J_\nu^2(X) \, dX}{\int_0^{ka} \frac{1}{X} J_\nu^2(X) \, dX}$$

where $\mu$ is the permeability.

Figure 8:
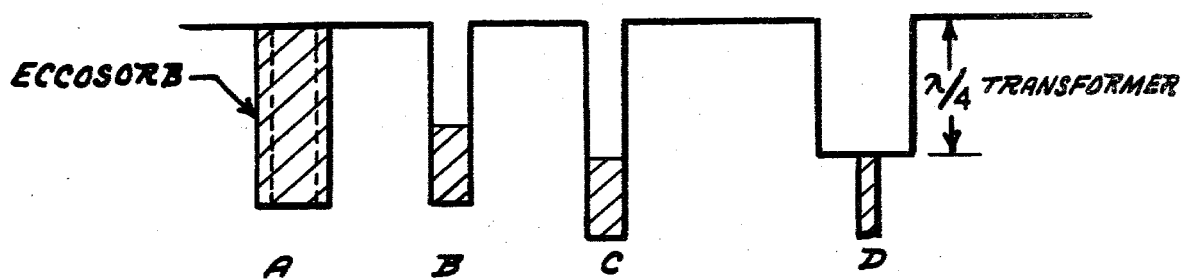
FIG. 8 is a cross-section of a typical mode filter apparatus slot.
Figure 9:
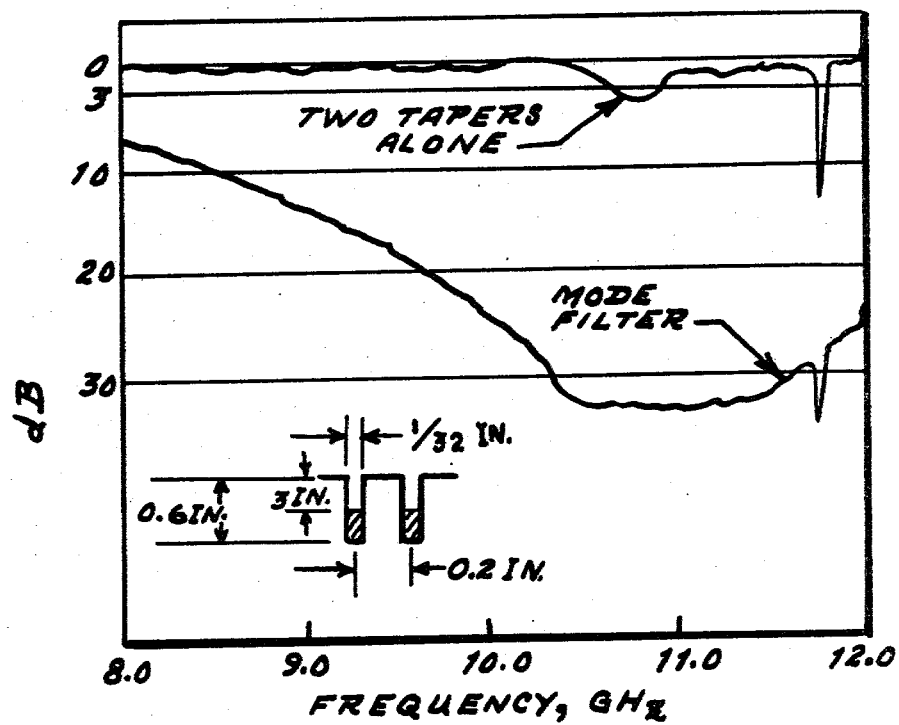
FIGS. 9 through 11 are graphical representations of the mode filter apparatus response for various slot depths.
Figure 10:
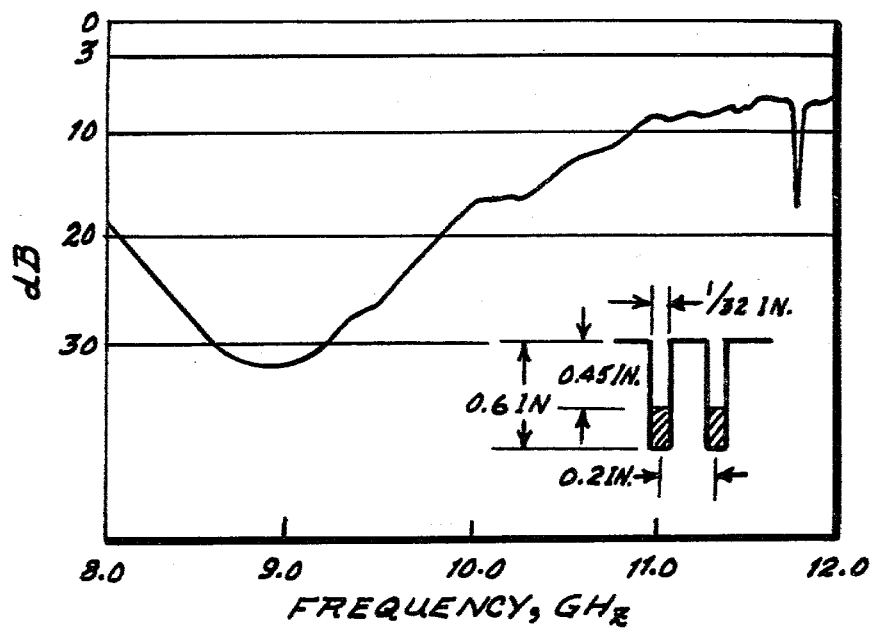
Figure 11:
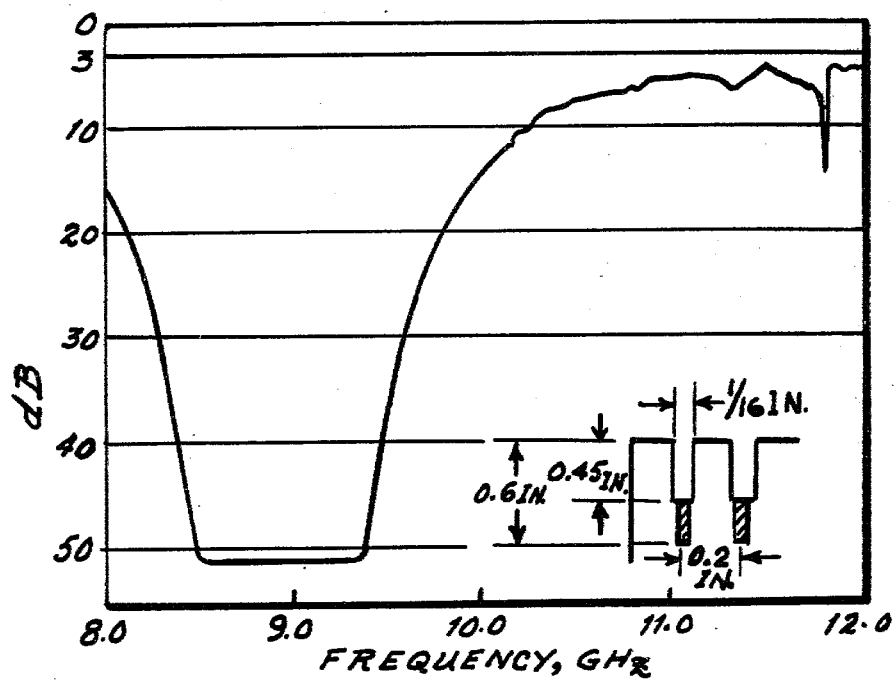

It is should be noted that since $Q_o$ is proportional to h, acceptable combiner design favors a small radial line height (spacing). Furthermore, the modes most important to remove, have currents closest to the center of the cavity. This requires that the cavity height should be least at that location for optimum mode filter effectiveness. Therefore the variable height of the center section of the top plate is used to control the effectiveness and mode selectivity characteristics of the primary mode filter (the radial pattern of slots being in the bottom plate). Several designs for slots that may be used in the bottom plate are shown in FIG. 8. The design shown in FIG. 8 example A (dotted lnes) is typical of previous designs. The shaded areas represent microwave absorbing materials. However, the effectiveness of the slot design may be required to be increased for many applications, such as the 64 diode power combiner. Increasing the width of the slot filled with absorbing material, as in FIG. 8 example A, improves its performance, but also results in increased losses due to fringing fields, in the azimuthally symmetric modes. The performance can be improved by recessing the absorbing material from the surface as in FIG. 8 example B. Increasing the recess to $\lambda/4$, as shown in example C, transforms the low impedance of the absorber to a higher impedance at the surface. Widening the transformer slot, as in example D, enhances this effect, Absorption characteristics for the recessed slot designs are presented in FIGS. 9, 10 and 11. The design shown in FIG. 10 is utilized in the present illustration, the 64 diode power combiner.

Although the invention has been described with reference to a particular embodiment, it will be understood to those skilled in the art that the invention is capable of a variety of alternative embodiments within the spirit and scope of the appended claims.

What is claimed is:

1. In a power combiner apparatus, a mode filter apparatus for multi-moded structures comprising in combination:
   a lower member being equally disposed about a center line, said lower member encompassing a bias resistor network, said bias resistor network extending radially from said center line, said bias resistor network having a common point at said center line, said lower member having an input bias connector connected to said common point of said bias resistor network, an upper plate mated with said lower member to form an enclosed cavity, said upper plate having a plurality of diodes mounted in said upper plate around the periphery thereof, said plurality of diodes respectively having one end connected to said bias resistor network, said upper plate having a coupling probe mounted in the center thereof, said coupling probe interacting with said plurality of diodes to conduct the electromagnetic radiation received therefrom and present in said cavity, and, a mode filter means located on said lower member in said cavity, said mode filter means comprising a conductive material covering the top of said lower member to a predetermined height but not filling said cavity, said mode filter means having a plurality of resonant slots therein on said cavity side, said plurality of resonant slots extending radially from the center of said mode filter means toward the outer edge of said mode filter means, said plurality of resonant slots being arranged in a predetermined pattern, said predetermined pattern for said plurality of resonant slots includes resonant slots of varying length, width and depth, each slot of said plurality of resonant slots having an absorbing material positioned therein, said absorbing material filling the bottom of each slot of said plurality of resonant slots and extending therefrom to a predetermined height.

2. A mode filter apparatus as described in claim 1 wherein said upper plate includes a variable height center section, said center section extending from the center of said upper plate but excluding the area containing said plurality of diodes.

3. A mode filter apparatus as described in claim 1 wherein said absorbing material comprises microwave absorbing material.

4. A mode filter apparatus as described in claim 1 wherein said predetermined height of said absorbing material is less than one half the depth of each slot of said plurality of resonant slots.

5. A mode filter apparatus as described in claim 2 wherein said variable height center section is adjusted to control the mode selectivity characteristics of said mode filter means primary mode.

6. A mode filter apparatus as described in claim 3 wherein said predetermined height of said microwave absorbing material is less than one half the depth of each slot of said plurality of resonant slots.

7. A mode filter apparatus as described in claim 3 wherein said microwave absorbing material comprises Eccosorb.

8. A mode filter apparatus as decribed in claim 6 wherein said microwave absorbing material comprises Eccosorb.

* * * * *